(12) United States Patent
Ikeda (10) Patent No.: US 6,518,666 B1
(45) Date of Patent: Feb. 11, 2003

(54) CIRCUIT BOARD REDUCING A WARP AND A METHOD OF MOUNTING AN INTEGRATED CIRCUIT CHIP

(75) Inventor: Hironobu Ikeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/667,522

(22) Filed: Sep. 22, 2000

(30) Foreign Application Priority Data

Nov. 25, 1999 (JP) ............................................ 11-334019

(51) Int. Cl.[7] .............................................. H01L 23/48
(52) U.S. Cl. ...................................... 257/738; 257/706
(58) Field of Search ......................... 438/106; 257/706, 257/707, 790, 712, 737, 738, 778, 780, 747; 174/255; 361/688, 748, 761, 764

(56) References Cited

U.S. PATENT DOCUMENTS

| | | | | |
|---|---|---|---|---|
| 5,275,889 A | * | 1/1994 | Yokouchi et al. | 428/426 |
| 5,550,407 A | * | 8/1996 | Ogashiwa | 257/737 |
| 5,585,672 A | * | 12/1996 | Koike et al. | 257/707 |
| 5,744,863 A | * | 4/1998 | Culnane et al. | 257/712 |
| 5,789,820 A | * | 8/1998 | Yamashita | 257/787 |
| 5,886,408 A | * | 3/1999 | Ohki et al. | 257/720 |
| 5,970,319 A | * | 10/1999 | Banks et al. | 438/115 |
| 5,981,085 A | * | 11/1999 | Ninomiya et al. | 257/700 |
| 6,069,023 A | * | 5/2000 | Bernier et al. | 438/107 |
| 6,108,208 A | * | 8/2000 | Tustaniwskyj et al. | 361/705 |
| 6,133,071 A | * | 10/2000 | Nagai | 438/122 |
| 6,144,101 A | * | 11/2000 | Akram | 257/778 |
| 6,169,328 B1 | * | 2/2001 | Mitchell et al. | 257/778 |

FOREIGN PATENT DOCUMENTS

JP          10-229102          8/1998

* cited by examiner

Primary Examiner—Kamand Cuneo
Assistant Examiner—Lourdes Cruz
(74) Attorney, Agent, or Firm—Young & Thompson (57) ABSTRACT

A circuit board includes a wiring board 2 and plural integrated circuit chips (LSI 1) mounted on the wiring board. At least one of the integrated circuit chips is mounted on a first surface of the wiring board 2 as a flip chip and the part mounted as a flip chip is sealed with resin. Further, a bare plate (a flat plate 5) is mounted on a second surface of the wiring board 2 with a resin (sealing resin 3) opposite the first surface where the integrated circuit chip mounted as a flip chip.

8 Claims, 11 Drawing Sheets

LAYOUT A
(8 CHIP CAPACITORS)

Fig. 8(a)

LAYOUT B
(15 CHIP CAPACITORS)

Fig. 8(b)

LAYOUT C
(24 CHIP CAPACITORS)

LAYOUT D
(24 CHIP CAPACITORS)

Fig. 12(a)

LAYOUT E
(24 CHIP CAPACITORS)

Fig. 12(b)

LAYOUT F
(24 CHIP CAPACITORS
 4 CHIP RESISTERS)

CIRCUIT BOARD REDUCING A WARP AND A METHOD OF MOUNTING AN INTEGRATED CIRCUIT CHIP

BACKGROUND OF THE INVENTION

1. Field of the Invention

The present invention relates to a circuit board and a method of mounting an integrated circuit chip, as a chip-on-board (COB).

2. Description of the Related Art

An integrated circuit chip (hereinafter called LSI) can be mounted on a wiring board as a flip chip and a connection thereto sealed with resin. Generally, the coefficient of thermal expansion of the wiring board is large, compared with that of the LSI. However, when a soft printed wiring board is used, the portion where the LSI is mounted is easily deformed on the side where LSI is mounted, because a difference in coefficients of thermal expansion between the wiring board and LSI causes a convex warp.

Figure 15:
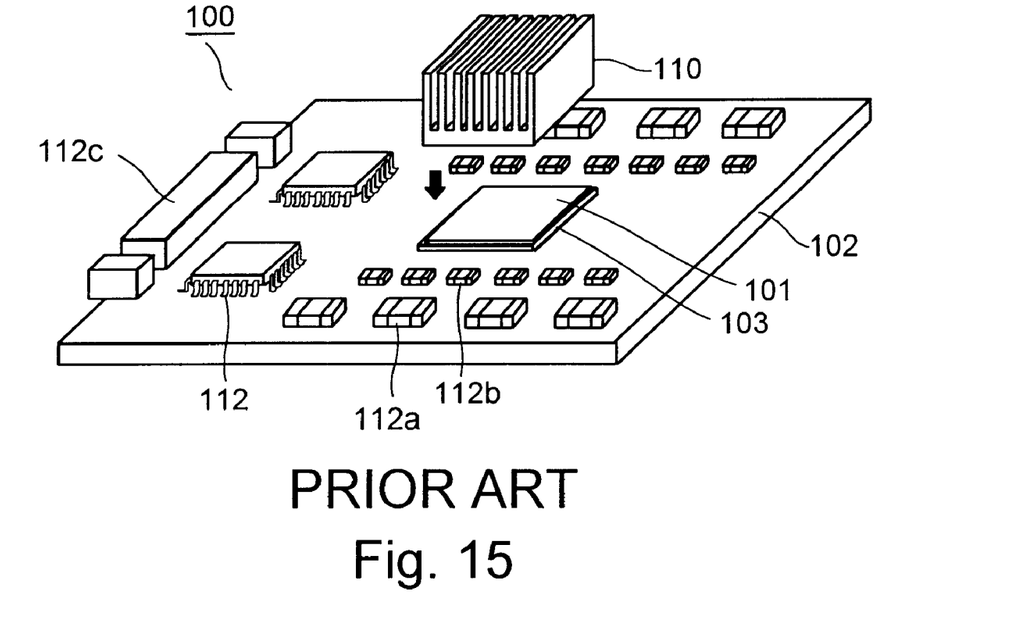
FIG. 15 is a perspective view showing general COB.

Referring to FIG. 15, a COB 100 may include active elements such as LSI 101 and a driver IC 112, a passive element such as a tantalum capacitor 112a, a chip capacitor 112b and a connector 112c mounted on wiring board 102. Sealing resin 103 is injected between LSI 101 and the wiring board 102, and a heat sink 110 for outgoing radiation is attached on LSI 101 via a thermal conduction member. The chip capacitor 112b that functions as a bypass capacitor of each LSI 101 is also soldered on the wiring board 102. Each terminal of the connector 112c is connected to LSI 101 and others via wiring provided on the surface or inside the wiring board 102. Therefore, COB 100 is electrically connected to an external device via the connector 112c.

Figure 16:
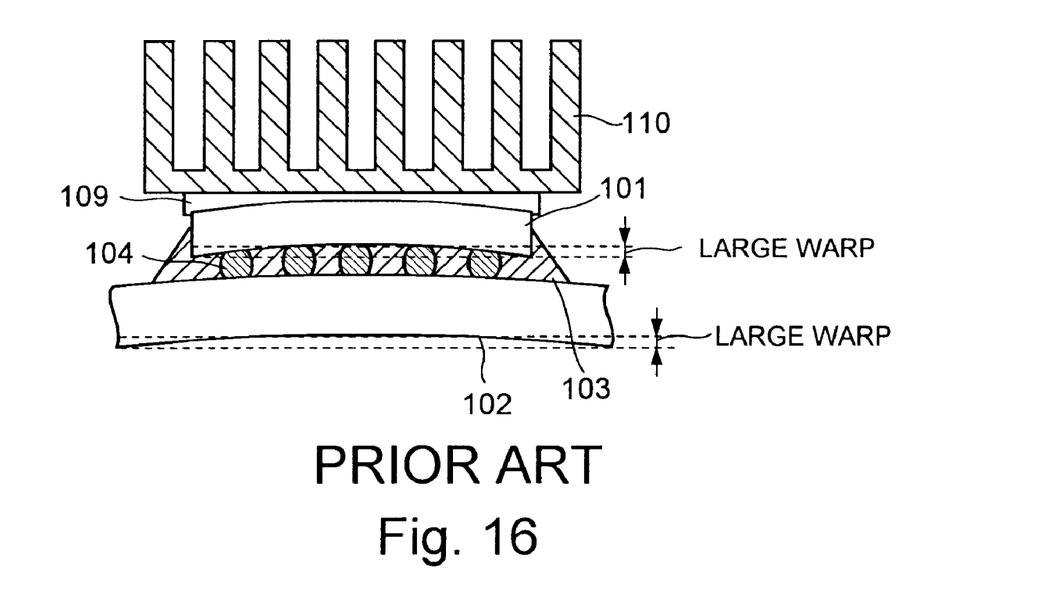
FIG. 16 is a sectional view showing an example of prior art.

Referring to FIG. 16, when the heat sink 110 is attached to the back of LSI 101, the thickness of a thermal conduction member 109 is not uniform. When the distance between the heat sink 110 and LSI 101 increases in the periphery, the heat resistance increases, degrading the outgoing radiation. Also, depending upon a temperature change while LSI 101 is operated, the warp of the LSI may change, causing peeling of the thermal conduction member 109. When the warp is further increased, the LSI may crack.

To solve the problems described above, a structure in which the warp of LSI seldom changes is required.

Japanese published unexamined patent application No. Hei 10-229102 discloses a technique for preventing an LSI chip from being warped by mounting another LSI chip on the back of a wiring board opposite to the LSI chip mounted on the wiring board is. However, this technique can be applied only when two LSI chips having the same shape are packaged as one pair.

Also, a few hundred to more than a thousand solder bumps are generally provided on one side of an LSI chip. If an LSI chip is mounted on both sides of a wiring board, then an electrode pad is also required to be provided on both sides of the wiring board. Therefore, the structure of the wiring board becomes very complex and the manufacture is difficult. In the future, as large scale integrated circuits are enlarged, the number of the pins will increase. From the viewpoint of manufacturing a wiring board, it is not good policy to adopt the technique disclosed in the above-noted patent application to prevent the LSI from being warped.

SUMMARY OF THE INVENTION

The invention is made to solve the above-described problems and the object is to provide the circuit board and the method of mounting an integrated circuit chip wherein the warp of the LSI can easily be reduced when plural LSIs are mounted on a wiring board.

To achieve such an object, the circuit board according to the invention is based upon the structure of an integrated circuit chip provided with a wiring board and a plurality of integrated circuit chips mounted on the wiring board, at least one of the integrated circuit chips is mounted on a first surface of the wiring board as a flip chip with a sealing resin, and a bare plate is mounted with a resin directly opposite the integrated circuit chip on a second surface of the wiring board opposite the first surface.

The invention inhibits the warp of the LSI as described above. Furthermore, the structure where the effect of outgoing radiation is high can be acquired by providing a uniformly thin thermal conduction member on a face where a heat sink and LSI are bonded. Also, in the structure, arranging the chip capacitor on the wiring board between the plate on the second surface and the wiring board can inhibit the rapid variation in voltage of the LSI, and high-speed operation can be realized.

BRIEF DESCRIPTION OF THE DRAWINGS

The above and other objects, features and advantages of the present invention will become more apparent upon a reading of a following detailed description taken in conjunction with the accompanying drawings, in which.

DESCRIPTION OF THE PREFERRED EMBODIMENT

Figure 1:
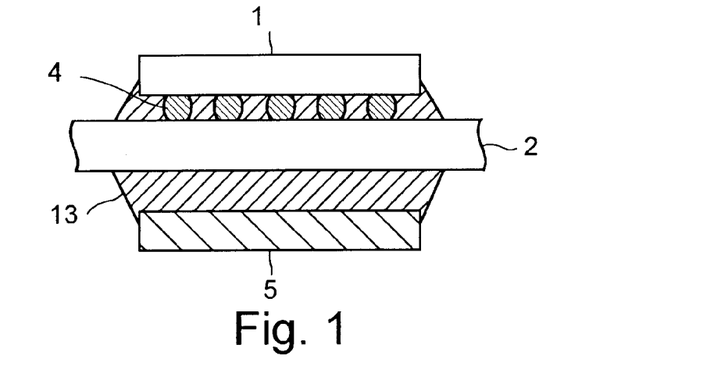
FIG. 1 is a sectional view showing a first embodiment according to the invention.

Referring FIG. 1, pads corresponding to the arrangement of electrodes in LSI 1 are provided on a first surface of a wiring board 2, and the electrodes in LSI 1 and pads on the wiring board 2 are connected in the form of a flip chip. The electrodes are arranged on the periphery of LSI 1 or in the form of a grid and are connected via conductive material such as solder. Furthermore, sealing resin 3 is filled in a connection with LSI 1 to mechanically reinforce the connection with LSI 1 and to prevent the infiltration of moisture from the outside and corrosion. A bare plate 5 is arranged opposite to LSI 1 on a second surface of the wiring board 2 opposite the first surface, and is fixed via sealing resin 13. It is desirable that the coefficient of thermal expansion of the bare plate 5 arranged on the second surface of the wiring board 2 is equal to or less than that of the wiring board 2 and the lateral and longitudinal dimensions of the bare plate 5 are approximately equal to those of LSI 1. The inventors have verified by experiments that the lateral and longitudinal dimensions of the bare plate 5 have only to be within 80 to 120% of the lateral and longitudinal dimensions of LSI 1. If LSI 1 is a square one side of which is 20 mm$^2$, the bare plate 5 has only to be a square one side of which is 16 to 24 mm$^2$.

Generally, the coefficient of thermal expansion of the wiring board 2 is large, compared with that of LSI 1. Therefore, a convex warp is caused on the side where LSI 1 is mounted because of difference in a coefficients of thermal expansion between the wiring board 2 and LSI 1 in a state where no flat plate is arranged on the back of the wiring board 2 as in an example of the prior art. As the apparent thickness of the wiring board is increased by fixing a bare plate 5 made of material having the same coefficient of thermal expansion as that of the wiring board 2 in this embodiment, the rigidity of the wiring board 2 is enhanced, the warp of LSI 1 can be reduced.

Referring to FIGS. 2 to 5, a manufacturing process for this embodiment will be described.

Figure 2:
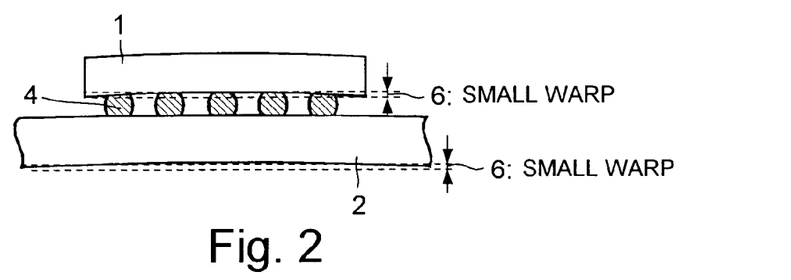
FIG. 2 is a first sectional view showing the manufacturing process of the circuit board shown in FIG. 1.

As shown in FIG. 2, pads corresponding to the arrangement of electrodes of LSI 1 are provided on the wiring board 2 and are electrically connected to the electrodes of LSI 1 by soldering and others. As a process, spherical solder bumps (for example, $Sn_{63}/Pb_{37}$ wt % or $Sn_5/Pb_{95}$ wt %) are provided beforehand to the electrodes of LSI 1, and cream solder (for example, $Sn_{63}/Pb_{37}$ wt %) is printed beforehand on each pad of the wiring board 2. LSI 1 is mounted so that the pad of the wiring board 2 and the solder bumps of LSI 1 are opposite and the connection of the wiring board 2 and LSI 1 is completed by performing heating reflowing (for example at 210° C.) in a hot blast stove or similar technique and cooling.

At this time, if there is a difference in coefficients of thermal expansion of LSI 1 and that of the wiring board 2, a small warp 6 is caused where the side on which LSI 1 is mounted is convex. When LSI 1 is made of silicon, the coefficient of thermal expansion of LSI 1 is approximately 3 ppm/° C., while the coefficient of thermal expansion of the wiring board made of organic material such as epoxy resin is approximately 12 to 20 ppm/° C. When reflowing solder is melted and no stress is applied to LSI 1 and the wiring board 2 from the outside, no deformation is caused. LSI 1 and the wiring board 2 are mechanically fixed when temperature is lower than the solidification line of solder (for example, in the case of solder made of Sn of $_{63}$ wt % and Pb of $_{37}$ wt %, 183° C.) While it is being restored from high temperature to room temperature (for example, 25° C.), LSI 1 and the wiring board 2 contract. Since the coefficient of thermal expansion of the wiring board 2 is larger than that of LSI 1, the quantity of contraction is also large and as temperature lowers, a convex warp is caused on the side on which LSI 1 is mounted. Thermal stress caused by difference in a coefficient of thermal expansion between the wiring board 2 and LSI 1 concentrates at the connection 4. In the case of soldering, as solder is relatively soft material, deformation is caused and as a result, a small warp 6 is caused.

Figure 3:
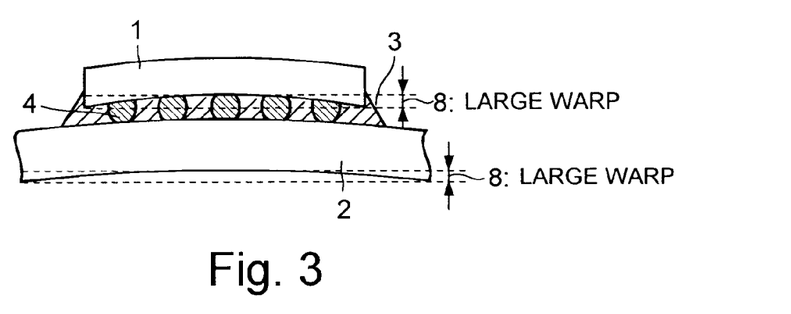
FIG. 3 is a second sectional view showing the manufacturing process.

Referring to FIG. 3, after the connection 4 is cleaned, liquid sealing resin is filled from the periphery of LSI 1. The sealing resin 3 is epoxy or thermoplastic insulating resin and is filled at temperature (for example, 60° C.) suitable for the fluidity of sealing resin to fill in small clearance between LSI 1 and the wiring board 2. Sealing resin 3 is required to be filled to secure the reliability of connection in the connection 4. Filling is normally started from one side or adjacent two sides of LSI 1, taking care not to include bubbles in the connection 4. After filling is completed, sealing resin 3 is heated to harden it (for example, at 150° C. for 30 minutes). As LSI 1 and the wiring board 2 are thermally expanded again during heating, the existing convex warp on the side of LSI is reduced and becomes flatter. However, when it is restored to ordinary temperature after hardening, thermal contraction is caused again and as LSI 1 and the wiring board 2 are completely fixed via the sealing resin 3, a convex large warp 8 is caused on the side where LSI 1 is mounted. For example, in case the outline of LSI 1 is 10 mm×10 mm and the wiring board 2 is made of FR4 (a glass epoxy board) with a thickness of 1 mm, a warp of approximately 50 to 100 μm may be caused.

Figure 4:
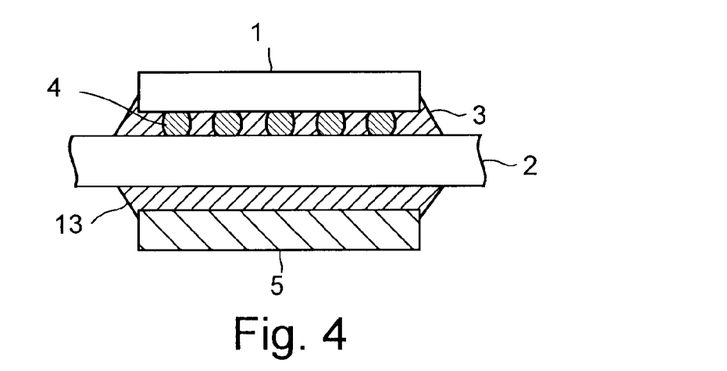
FIG. 4 is a third sectional view of manufacturing process.

FIG. 4 is a sectional view showing structure in which LSI 1 is mounted on the wiring board 2 as a flip chip, sealing resin 3 is filled in the connection 4 and the bare plate 5 is arranged directly opposite the LSI 1 on the second surface of the wiring board 2 opposite the first surface. Referring to FIG. 4, the wiring board 2 is turned upside down so that the back, that is second surface, is located on the upside, the sealing resin 13 is placed in the center portion opposite the LSI 1, the bare plate 5 is pressed on the sealing resin 13 and heat hardening is performed in that state. If the sealing resin 3 used for filling the connection 4 is used for the material of the sealing resin 13, LSI 1 and the wiring board 2 are thermally expanded again because heat hardening temperature is 150° C. and when temperature reaches 150° C., a warp is reduced. As the sealing resin 13 is hardened in this state, the quantity of a warp after cooling depends upon the material of the flat plate.

In case silicon which is the same material as that of LSI 1 is used for the material of the bare plate 5 for example, force in a direction of a warp is set off because the wiring board 2 is put between two silicon board and substrate and a warp is reduced up to approximately zero. A warp can be reduced by using material smaller in a coefficient of thermal expansion than that of the wiring board 2 such as alumina ceramics (approximately 7 ppm/° C., a 42 alloy (approximately 6 ppm/° C.), zirconia (approximately 11 ppm/° C.) and forsterite (approximately 10 ppm/° C.) for the bare plate 5. Also, in case material having the similar coefficient of thermal expansion as that of the wiring board 2 is used for the material of the bare plate 5, effect in reducing a warp is smaller, compared with a case in which a material with a small coefficient of thermal expansion is used. However, as the apparent thickness of the wiring board is increased, the rigidity of the wiring board is enhanced and effect that a warp is reduced is acquired though the effect is small. In case the area of the bare plate 5 is smaller than that of LSI 1, thermal stress concentrates in the periphery of LSI 1 and as a problem such as the breakage of the sealing resin 3 and the connection 4 may occur, it is undesirable. The reliability of the connection 4 can be enhanced by enlarging the area of the bare plate 5, compared with that of LSI 1, however, the best structure is structure in which the area of LSI 1 and the bare plate 5 are approximately equalized.

Figure 5:
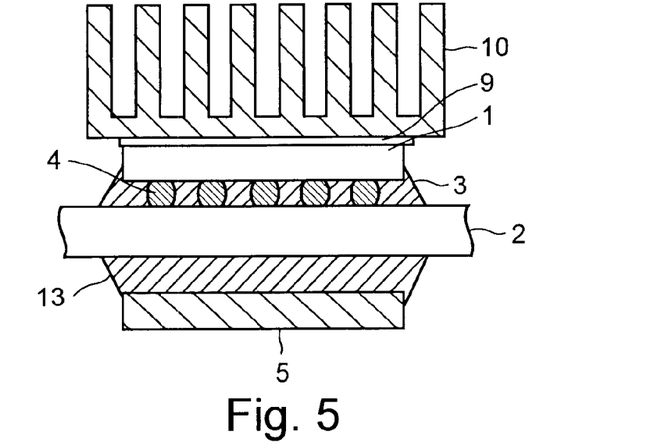
FIG. 5 is a fourth sectional view of manufacturing process.

Referring to FIG. 5, a heat sink is attached on the back of LSI 1. For the material of the heat sink 10, aluminum which is excellent in a radiation characteristic and others are desirable and the heat sink is attached on a surface of LSI 1 opposite the wiring board 2 via a thermal conduction member 9. The thermal conduction member 9 is made of material excellent in thermal conductivity and for example, epoxy resin including silver filler, a silicone compound including alumina ceramics filler and others are used. As a warp is reduced on the back of LSI 1 owing to effect produced by the bare plate 5, the thermal conduction member for transmitting the heat of LSI 1 to the heat sink 10 can be uniformly thin and the effect of efficient radiation can be acquired.

As is clear from the above description, the warping of LSI 1 can be reduced by arranging the bare plate 5 on the second surface of the wiring board opposite the first surface where the LSI 1 is mounted as a flip chip. Furthermore, as the thermal conduction member provided on the surface on which the heat sink and LSI are bonded can be uniformly thinned, LSI package structure having enhanced effect of radiation can be acquired.

Figure 6:
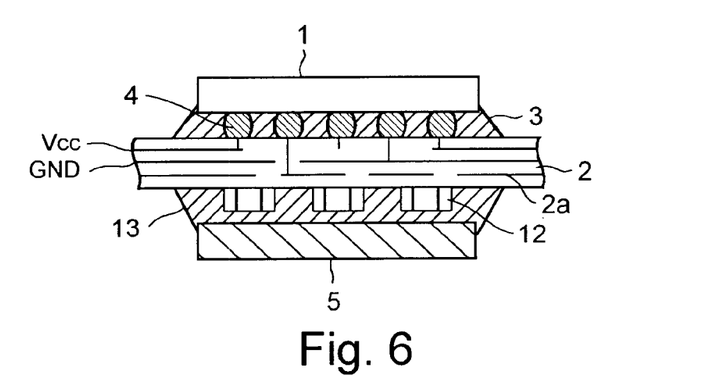
FIG. 6 is a sectional view showing a second embodiment according to the invention.

Referring to FIG. 6, other embodiments of the invention will be described.

Pads corresponding to the arrangement of electrodes of LSI 1 are provided on a first surface of a wiring board 2, and the electrodes of LSI 1 and the pads of the wiring board 2 are electrically connected in the form of a flip chip. The electrodes are arranged in the periphery of LSI or in the form of a grid and are connected via conductive material such as solder. Further, sealing resin 3 is filled in a connection with LSI 1 to mechanically reinforce the connection with LSI 1 and to prevent the infiltration of moisture from the outside and corrosion. Pads on which chip capacitors 12 are mounted are provided in an area having substantially the same outline as that of LSI 1 on a second surface of the wiring board 2 opposite a first surface where LSI 1 is mounted. The chip capacitor 12 is electrically connected to the pad, further a bare plate 5 is arranged on the chip capacitor 12, and the wiring board 2 and the bare plate 5 are fixed via sealing resin 13. The chip capacitor 12 functions as a bypass capacitor provided to reduce noise voltage generated on a power line and a ground line and is provided between a power source Vcc and a ground GND.

The structure reduces the warping of LSI 1 to substantially zero as in the structure having no chip capacitor shown in FIG. 1. Furthermore, as the chip capacitor is arranged just directly opposite the LSI 1 on the second surface of the wiring board 2 opposite the first surface, the structure has the effect of inhibiting the variation of the voltage of LSI 1 and is suitable for high-speed operation.

For an assembly process, cream solder for mounting the chip capacitor is printed on the pad provided on the second surface of the wiring board 2, and the soldering of the chip capacitor 12 is completed by mounting the chip capacitor 12 on the cream solder and performing heat reflowing afterward. The succeeding process may be the same as that of the structure having no chip capacitor shown in FIG. 2. For inhibiting the variation of voltage during the operation of LSI 1, it is sufficient to arrange a capacitor in the vicinity of LSI 1. For inhibiting the variation of voltage during operation at high speed, it is effective to arrange a capacitor in a position as close to LSI 1 as possible. In flip-chip mounting structure in which electrodes are arranged on the overall circuit surface of LSI 1, it is most effective to arrange a capacitor on the back of a part where LSI 1 is mounted on the wiring board.

Figure 7:
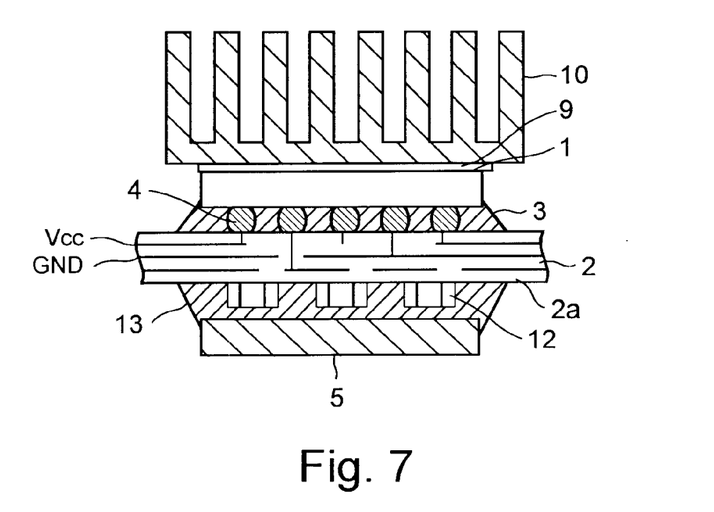
FIG. 7 is a sectional view showing the second embodiment.

In the structure shown in FIG. 6, the bare plate 5 is arranged on the upper surface of the chip capacitor 12, however, effect of inhibiting the warping of LSI 1 is similarly acquired as in the structure having no chip capacitor shown in FIG. 1. Furthermore, as shown in FIG. 7, in structure in which a heat sink 10 is attached to a surface of LSI 1 opposite the wiring board 2, a thermal conduction member 9 can be also uniformly thin and the effect of efficient radiation can be acquired. For the material of the adopted bare plate 5, as the bare plate 5 is arranged over the chip capacitor 12, the electrodes of the chip capacitor 12 may be short-circuited in case conductive material is used. Therefore, it is desirable to use an insulating material such as alumina. If a metal material is used, an insulating coating such as polyimide should be applied.

Figure 8A:
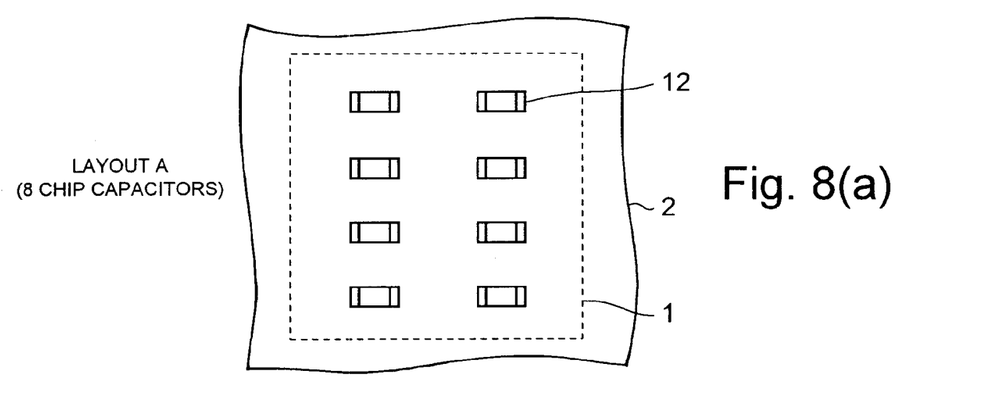
FIGS. 8(a) to 8(c) are plans showing layouts of chip capacitors.
Figure 8B:
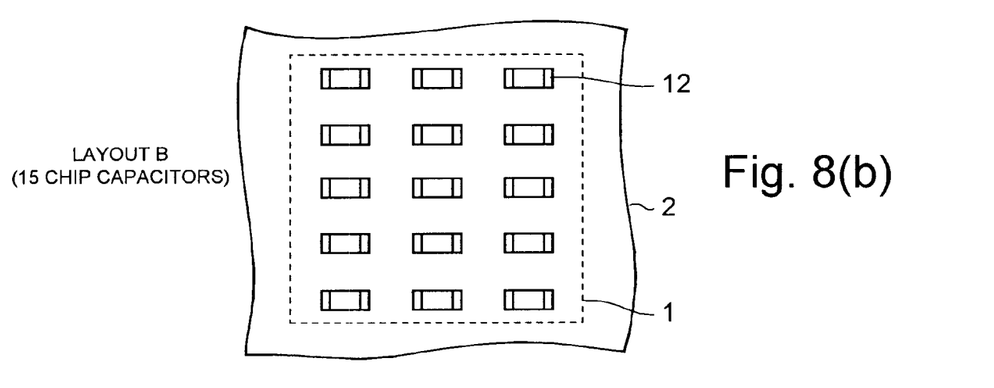
Figure 8C:
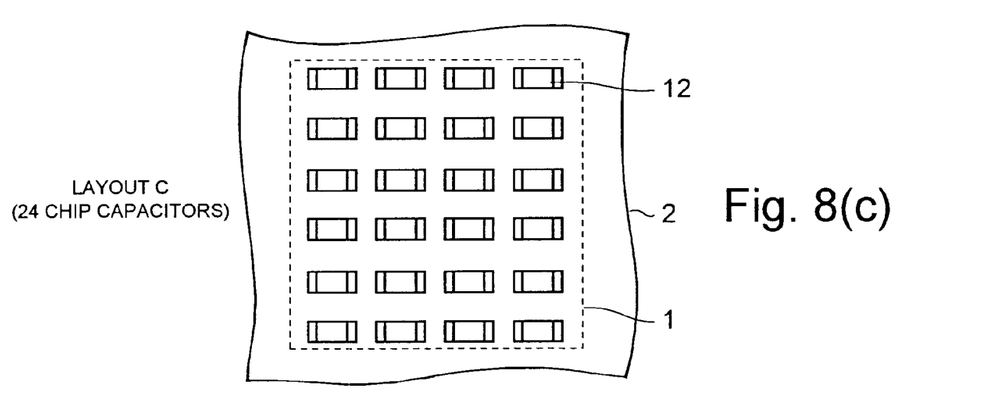
Figure 9:
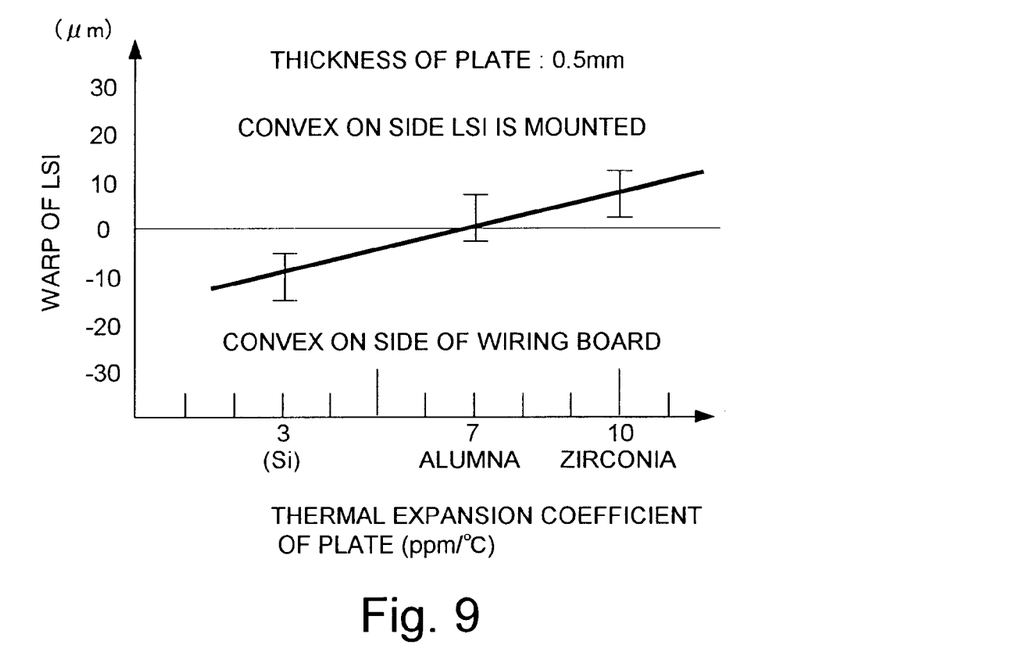
FIG. 9 is a graph showing relationship between the coefficient of thermal expansion of a bare plate and a warp of LSI.

Referring to FIGS. 8(*a*)–(*c*), layouts of the chip capacitor are shown, and the layout shown in FIG. 8(*b*) will be described below. Suppose that the area of LSI and the bare plate is a square one side of which is 10 mm², the outline of the chip capacitor 12 is 1.6 mm×0.8 mm and the thickness is 0.5 mm. Fifteen pieces of chip capacitors 12 are arranged. The shape of the chip capacitors 12 is preferably equal and the quantity of the warping of LSI for the material of the attached bare plate is shown in FIG. 9. The thickness of the bare plate is uniformly 0.5 mm.

Figure 10:
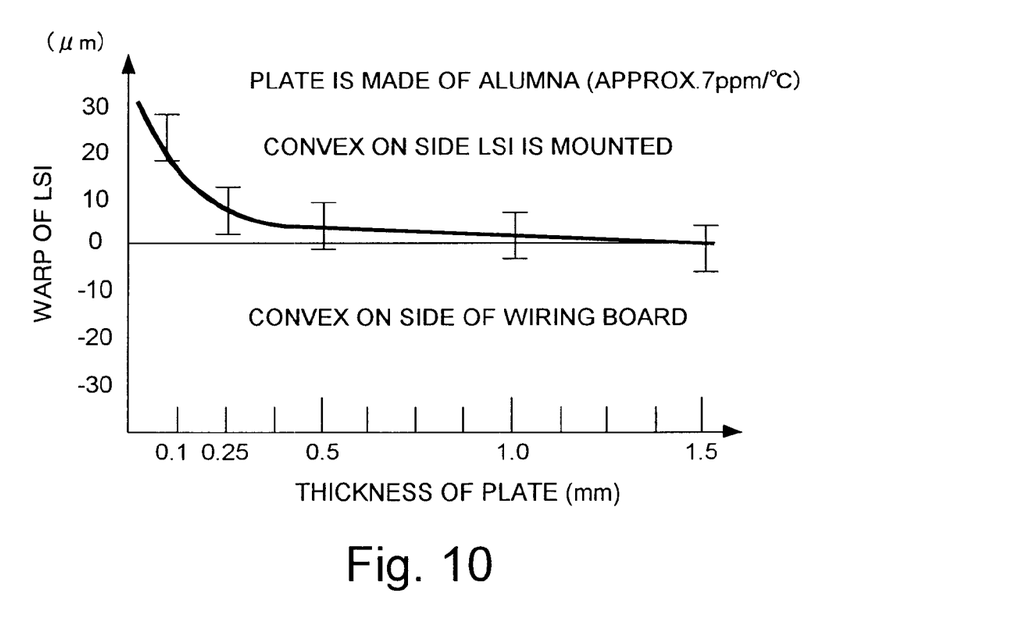
FIG. 10 is a graph showing relationship between the thickness of the bare plate and a warp of LSI.

FIG. 10 is a graph showing the quantity of a warp of LSI 1 for the thickness of the bare plate 5. The bare plate 5 is made of alumina. When the thickness exceeds 0.5 mm, the rigidity is enhanced and the quantity of a warp is balanced.

Figure 11:
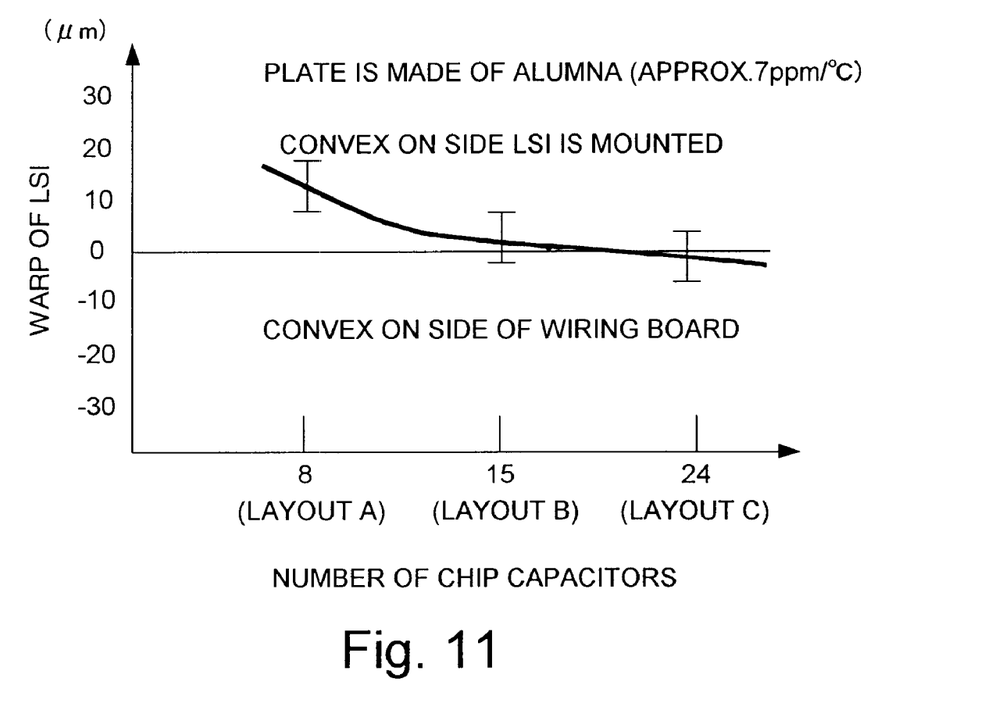
FIG. 11 is a graph showing relationship between the number of chip capacitors and a warp of LSI.

FIG. 11 is a graph showing the quantity of a warp of LSI 1 for the number (the density) of the chip capacitors. The bare plate 5 is made of alumina (7 ppm/° C.) and the thickness is uniformly 0.5 mm. The graph shows that when the density of the chip capacitors is high, the rigidity of the board itself is enhanced and the quantity of a warp is reduced. The shape of the chip capacitor may be different depending upon difference in capacity and precision. For example, the thickness of a chip capacitor called "1608" the outline of which is 1.6 mm×0.8 mm may be approximately 0.5 mm or may be 0.8 mm. In case such different chip capacitors are mounted, it is desirable that a thick chip capacitor is arranged at the corners and in the periphery to stabilize the bare plate attached to the upper surface of the chip capacitors. An example, in which the chip capacitors are arranged, is shown, however, another passive device such as a chip resistor and a choke coil can be similarly arranged. Furthermore, any type of a mere ceramic piece, a resin piece or a metal piece or plural types may be also combined and may be also used together with the passive device.

Figure 12A:
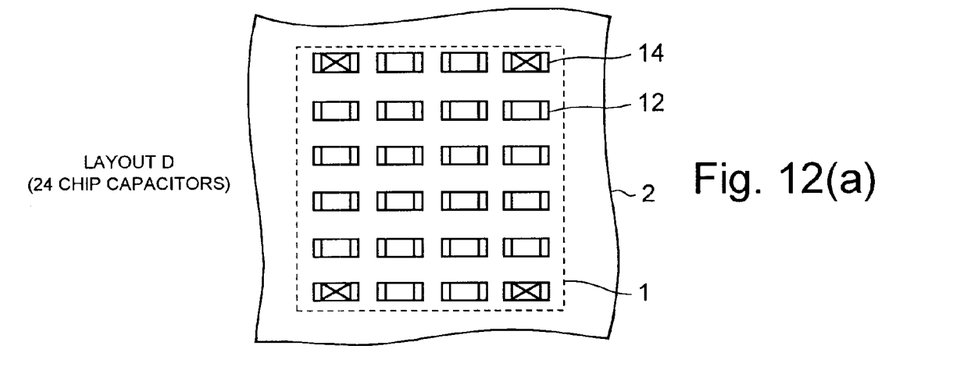
FIGS. 12(a) to 12(c) are plans showing layouts of chip capacitors.
Figure 12B:
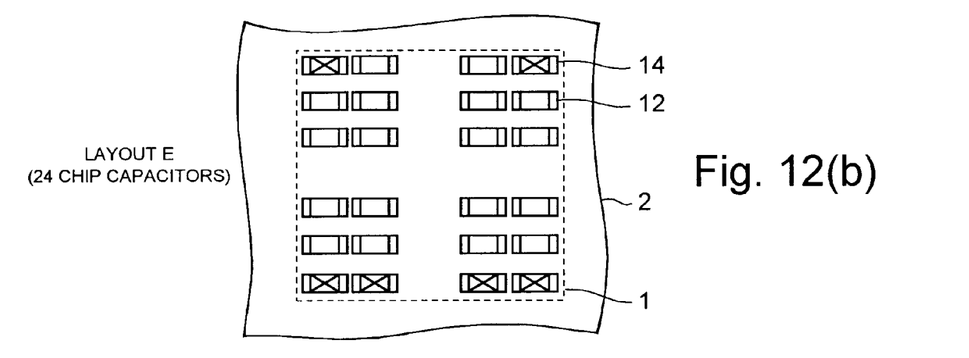
Figure 12C:
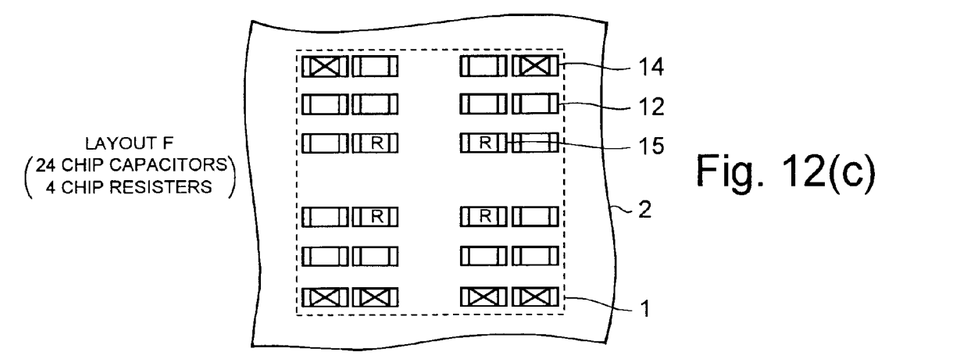

Referring to FIGS. 12(*a*)–(*c*), a few examples in which passive devices are arranged is shown. A layout D shown in FIG. 12(*a*) shows that 24 pieces of chip capacitors "1608" are mounted at an equal interval, thick ones having the thickness of 0.8 mm are mounted at the corners and the other 20 pieces are thinner than the thick ones and have the thickness of 0.5 mm. A layout E shown in FIG. 12(*b*) shows arrangement in which clearance in the center of the layout D is expanded in the shape of a cross. A layout F shown in FIG. 12(*c*) shows a case in which four chip capacitors in the center of the layout E are replaced with chip resistors. The thickness of the chip resistor is substantially the same as that of the thinner chip capacitor 12.

Figure 13:
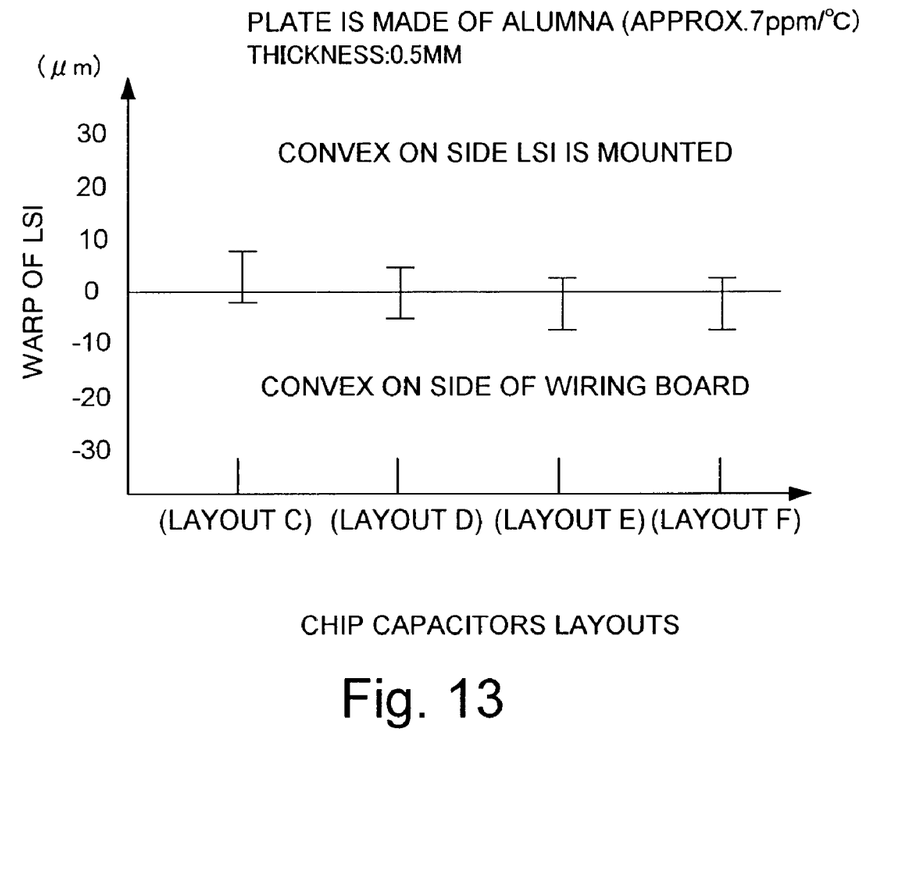
FIG. 13 is a graph showing relationship between a layout of chip capacitors and a warp of LSI.

FIG. 13 shows the quantity of a warp of LSI 1 for each layout. The bare plate 5 is zirconia (10 ppm/° C.) and the thickness is 0.5 mm. When the resin is contracted in a heat hardening process after filling, a phenomenon that the bare plate 5 and the wiring board 2 pull each other occurs. As in the layouts D to F, the chip capacitors at the corners are thick and sealing resin in the vicinity of the center is thick, the direction of a warp of LSI 1 is closer to the minus side than in the layout C in which the chip capacitors having the same height are uniformly arranged.

A manufacturing process in a second embodiment will be described below.

Figure 14:
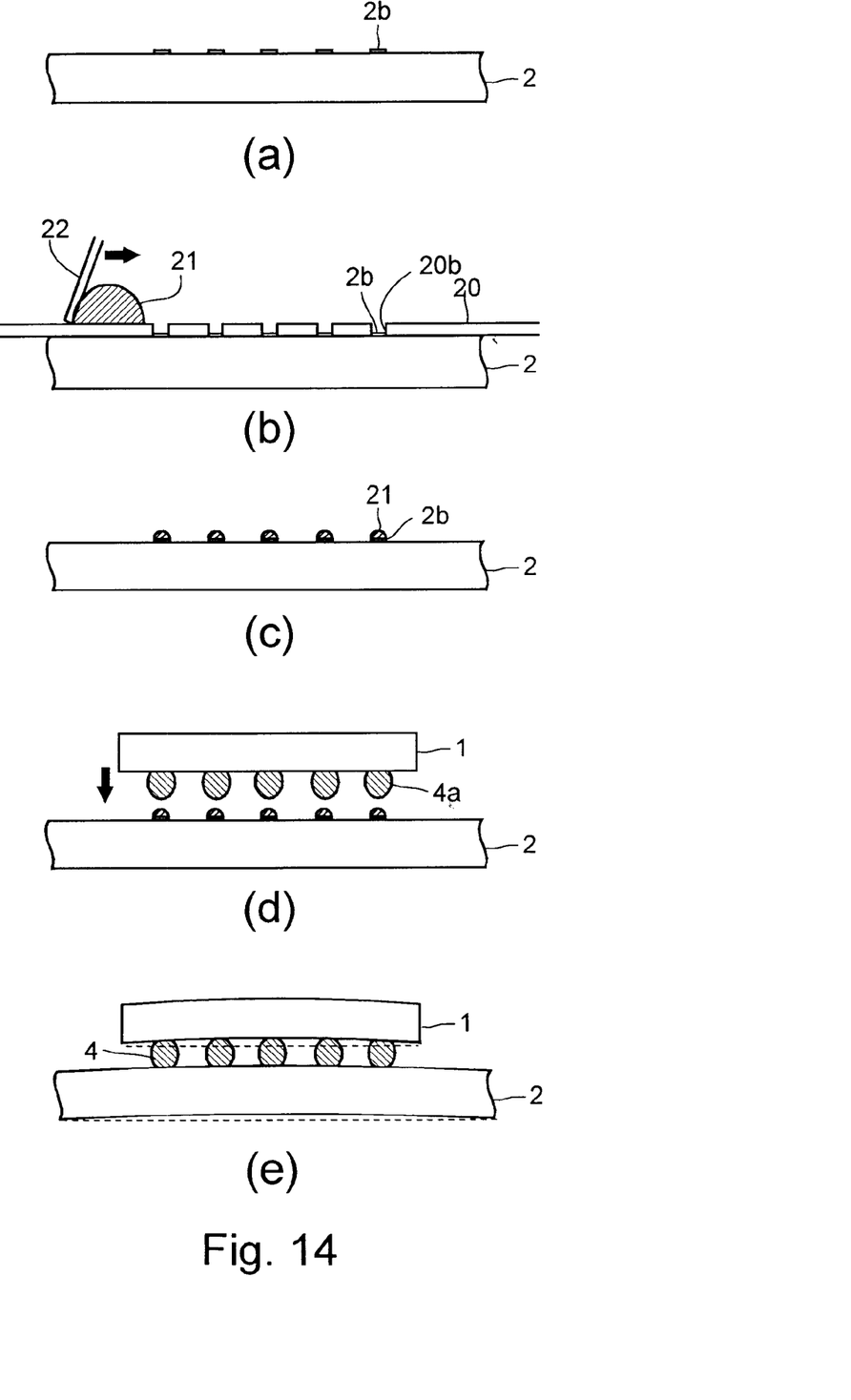
FIGS. 14(a) to 14(l) are sectional views showing the manufacturing process of the structure shown in FIG. 7.

Referring to FIG. 14(a), plural electrode pads 2b are provided on the wiring board 2 beforehand. Next, as shown in FIGS. 14(b) and 14(c), a mask 20 made of stainless steel having plural through holes 20a is laid on the wiring board 2. Each through hole 20a is provided so that it is coincident with the electrode pad 2b on the wiring board 2. Therefore, when the mask 20 is laid, only the electrode pad 2b is exposed at the bottom of the through hole 20a and cream solder 21 can be loaded only on the electrode pad 2b by expanding the cream solder 21 using a rubber squeegee 22.

Referring to FIGS. 14(d) and 14(e), LSI 1 in which solder bumps 4a are provided beforehand is mounted on the wiring board 2, the connection 4 is formed by melted solder by performing heat reflowing, and the wiring board 2 and LSI 1 are electrically connected. Furthermore, referring to FIGS. 15(f) and 14(g), resin 3a is filled between LSI 1 and the wiring board 2 by a capillary phenomenon by pouring the liquid resin 3a between LSI 1 the wiring board 2 using a dispenser 23. Referring to FIG. 14(h), clearance between LSI 1 and the wiring board 2 can be sealed with resin by curing and hardening the resin 3a. At that time, as the volume of the sealing resin 3a is slightly decreased, LSI 1 and the wiring board 2 are deformed and a convex warp is caused on the side of LSI 1. Referring to FIG. 14(i), a chip capacitor 12 is mounted on the wiring board 2 on the side on which LSI 1 is not mounted.

Referring to FIG. 14(j), after a bare plate 5 having the same size as that of LSI 1 is laid on the chip capacitor 12, resin 13a is poured between the bare plate 5 and the wiring board 2. Next, as shown in FIG. 14(k), clearance between the bare plate 5 and the wiring board 2 is sealed with resin 13 by curing and hardening the resin 13a. At that time, the resin 13a is contracted as described above, however, as a warp is caused in a direction reverse to the above warp, the whole is balanced and flattened. Finally, as shown in FIG. 14(l), packaging structure equivalent to this embodiment is completed by fixing a heat sink 10 on the back of LSI 1 via a thermal conduction member 9.

The wiring board may be, for example, a ceramic board, a board having a thin film wiring layer on a ceramic board, or a printed wiring board using organic resin such as epoxy resin. If the structure in which plural LSIs are mounted on one wiring board as flip chips, it is estimated that a warp of the whole package is very large, however, a warp of the whole LSI package can be prevented by arranging a bare plate opposite every location in which each LSI is mounted according to the invention.

In the first and second embodiments, for the connection with LSI, the soldering structure is described above, however, structure in which gold ball bumps are arranged on the side of LSI and a conductive adhesive, solder including In/Sn and solder including Ag/Sn are used on the side of the wiring board is also conceivable. For the shape of the bare plate, a concave form which can contain the chip capacitor and a form having projections at four corners to prevent contact with the chip capacitor are also conceivable.

As clear from the above description, in the structure in which LSI 1 is mounted on the first surface of the wiring board 2 as a flip chip and sealing resin 3 is filled in the connection with LSI, a warp of LSI can be inhibited by bonding the bare plate 5 on the second surface of the wiring board 2 opposite the first surface. Furthermore, as the thermal conduction member 9 provided to the surface on which the heat sink 10 and LSI 1 are bonded can be uniformly thinned, the structure having the effect of radiation can be acquired. Also, arranging the chip capacitors 12 between the bare plate 5 and the wiring board 2 can inhibit the rapid variation of voltage of LSI, and high-speed operation can be realized.

The invention is applied to so-called COB in which plural integrated circuit chips are mounted on the wiring board and in case at least one integrated circuit is mounted as a flip chip, the invention can be applied to the chip. Naturally, the invention may be also applied to plural chips mounted as a flip chip. Also, some of the plural integrated circuit chips may be also a quad flat package (QFP) and a small outline package (SOP). These chips are used for a temperature sensor and driver IC for controlling the sensor for example. Furthermore, not only the integrated circuit chip but also a passive device such as the chip capacitor and the chip resistor may be mounted together.

Although the preferred embodiments of the present invention have been described in detail, it should be understood that various changes, substitutions and alternations could be made therein without departing from spirit and scope of the inventions as defined by the appended claims.

What is claimed is:

1. A circuit board comprising:
   a wiring board;
   a flip-chip integrated circuit chip mounted with a sealing resin on a first surface of said wiring board; and
   a bare plate mounted with a resin directly opposite said integrated circuit chip on a second surface of said wiring board opposite said first surface;
   wherein a coefficient of thermal expansion of said plate member is equal to or less than a coefficient of thermal expansion of said wiring board and is greater than a coefficient of thermal expansion of said integrated circuit chip.

2. The circuit board according to claim 1, wherein said bare plate has lateral and longitudinal dimensions that are 80 to 120% of corresponding lateral and longitudinal dimensions of said integrated circuit chip.

3. The circuit board according to claim 1, wherein said bare plate comprises one of alumina, a 42 alloy, zirconia or forsterite.

4. The circuit board according to claim 1, further comprising a heat sink mounted with a thermal conduction member on a surface of said integrated circuit chip opposite said wiring board.

5. The circuit board of claim 1, further comprising:
   plural chip capacitors between said bare plate and said wiring board;
   wherein said plural chip capacitors are positioned closer to one another opposite a periphery of said integrated circuit chip than opposite a center of said integrated circuit.

6. The circuit board of claim 1, further comprising:
   plural chip capacitors between said bare plate and said wiring board, respective said plural chip capacitors having different heights;

wherein the plural chip capacitors are arranged between the bare plate and the wiring board so that said plural chip capacitors having a relatively lesser said height are positioned opposite a vicinity of the center of said integrated circuit chip, and said plural chip capacitors having a relatively greater said height are positioned opposite a periphery of said integrated circuit chip.

7. The circuit board of claim 1, further comprising:

plural chip resistors between said bare plate and said wiring board;

wherein said plural chip resistors are positioned closer to one another opposite a periphery of said integrated circuit chip than opposite a center of said integrated circuit.

8. The circuit board of claim 1, further comprising:

plural chip resistors between said bare plate and said wiring board, respective said plural chip resistors having different heights;

wherein the plural chip resistors are arranged between the bare plate and the wiring board so that said plural chip resistors having a relatively lesser said height are positioned opposite a vicinity of the center of said integrated circuit chip, and said plural chip resistors having a relatively greater said height are positioned opposite a periphery of said integrated circuit chip.

* * * * *